US009471641B1

(12) United States Patent
Borghesani et al.

(10) Patent No.: US 9,471,641 B1
(45) Date of Patent: Oct. 18, 2016

(54) GENERATING BLOCK RECOMMENDATIONS BASED ON EXISTING MODEL INFORMATION

(71) Applicant: The MathWorks, Inc., Natick, MA (US)

(72) Inventors: Craig W. Borghesani, San Diego, CA (US); Douglas E. Eastman, La Mesa, CA (US)

(73) Assignee: The MathWorks, Inc, Natick, MA (US)

( * ) Notice: Subject to any disclaimer, the term of this patent is extended or adjusted under 35 U.S.C. 154(b) by 192 days.

(21) Appl. No.: 13/828,034

(22) Filed: Mar. 14, 2013

(51) Int. Cl.
*G06F 17/30* (2006.01)

(52) U.S. Cl.
CPC ................... *G06F 17/3053* (2013.01)

(58) Field of Classification Search
CPC ............ G06F 17/30864; G06F 17/30867; G06F 17/3087; G06F 17/3053
USPC ........................................................ 707/748
See application file for complete search history.

(56) References Cited

U.S. PATENT DOCUMENTS 5,974,409 A * 10/1999 Sanu et al.
6,848,078 B1 * 1/2005 Birsan et al. ................. 715/206

2003/0130821 A1 * 7/2003 Anslow et al. ............... 702/186
2008/0126394 A1 * 5/2008 Jain et al. ..................... 707/102
2010/0049736 A1 * 2/2010 Rolls et al. ................ 707/103 R
2010/0198572 A1    8/2010 Orofino, II et al.

OTHER PUBLICATIONS

Ramirez et al., "ArgoUML User Manual", http://argouml-stats.tigris.org/documentation/manual-0.34-single/manual.html, 2000, 212 pages.
Knowledge Based Silicon, "7.1 Dynamic Checking", Block HDL User's Manual V2.0, 1996, pp. 7-1/7-6.
X, "Better Block Diagram Object Selection Tools—NI Discussion Forums", http://forums.ni.com/t5/LabVIEW-Idea-Exchange/Better-block-diagram-object-selection-tools/idi-p2123058, Aug. 14, 2012, 3 pages.

* cited by examiner

*Primary Examiner* — Cam Truong
(74) *Attorney, Agent, or Firm* — Harrity & Harrity, LLP

(57) ABSTRACT

A device identifies models in a corpus of documents, and retrieves model information for the identified models. The device creates a block identifier for each block of the models based on the model information, and determines one or more blocks that connect to each block of the models, based on the model information. The device creates identifiers for the one or more blocks that connect to each block of the models, and assigns weights to the identifiers based on sources of the models or a number of times the one or more blocks connect to each block of the models. The device ranks the identifiers based on the weights assigned to the identifiers, and store the ranked identifiers and the block identifiers in a data structure.

20 Claims, 16 Drawing Sheets

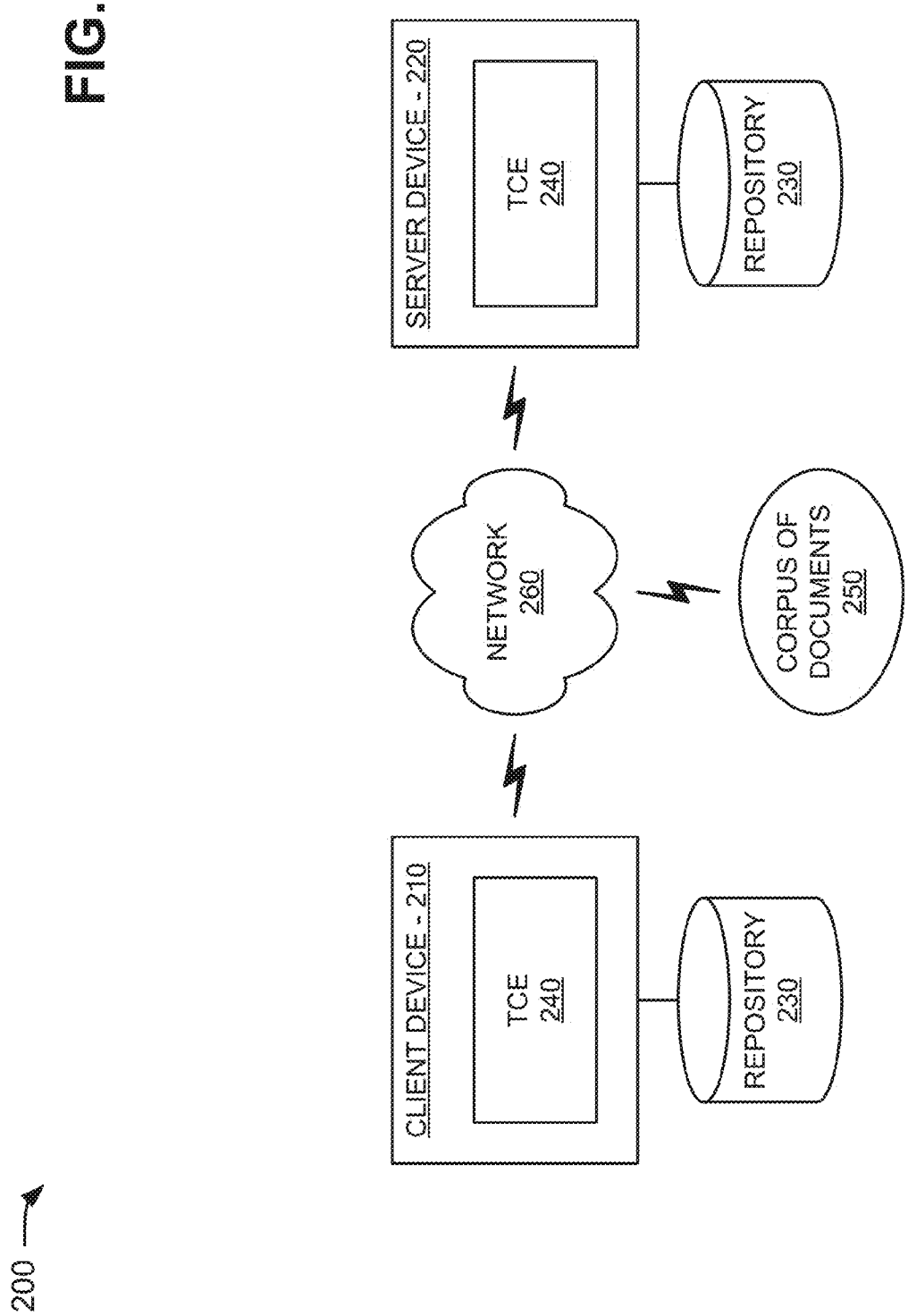

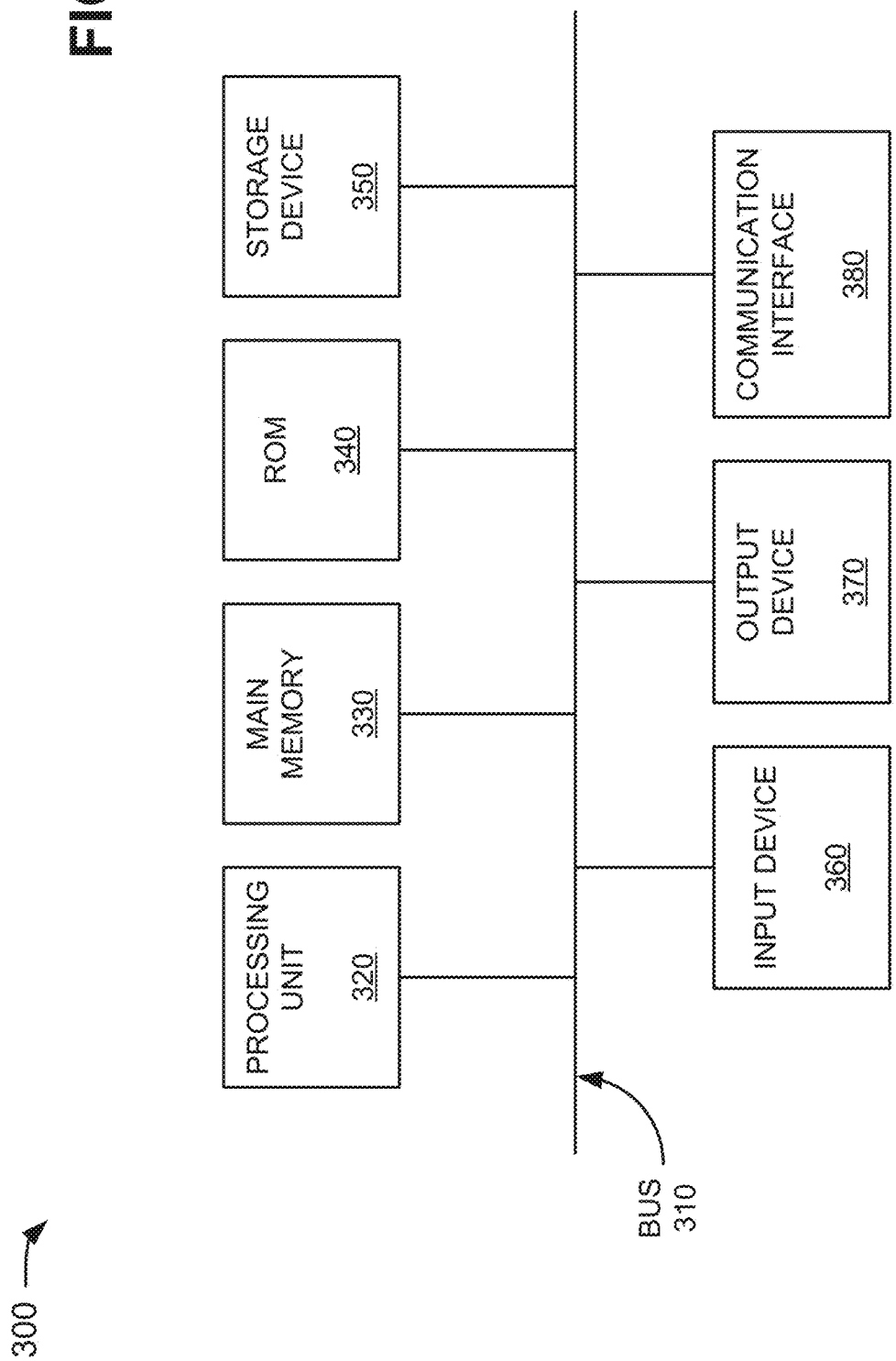

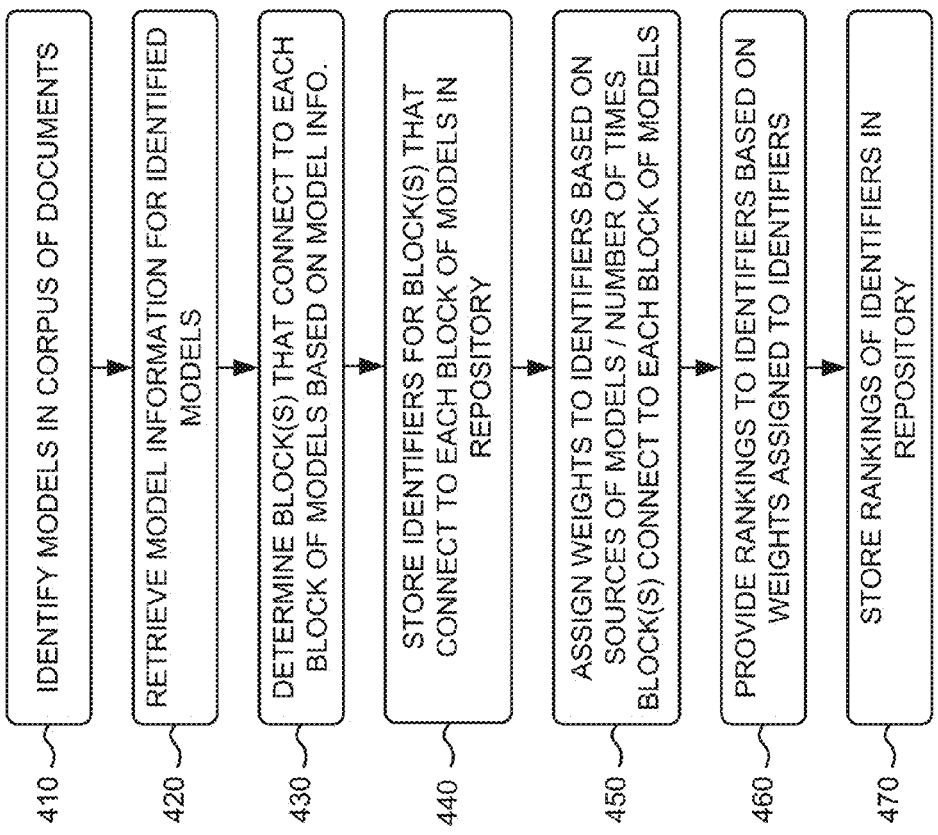

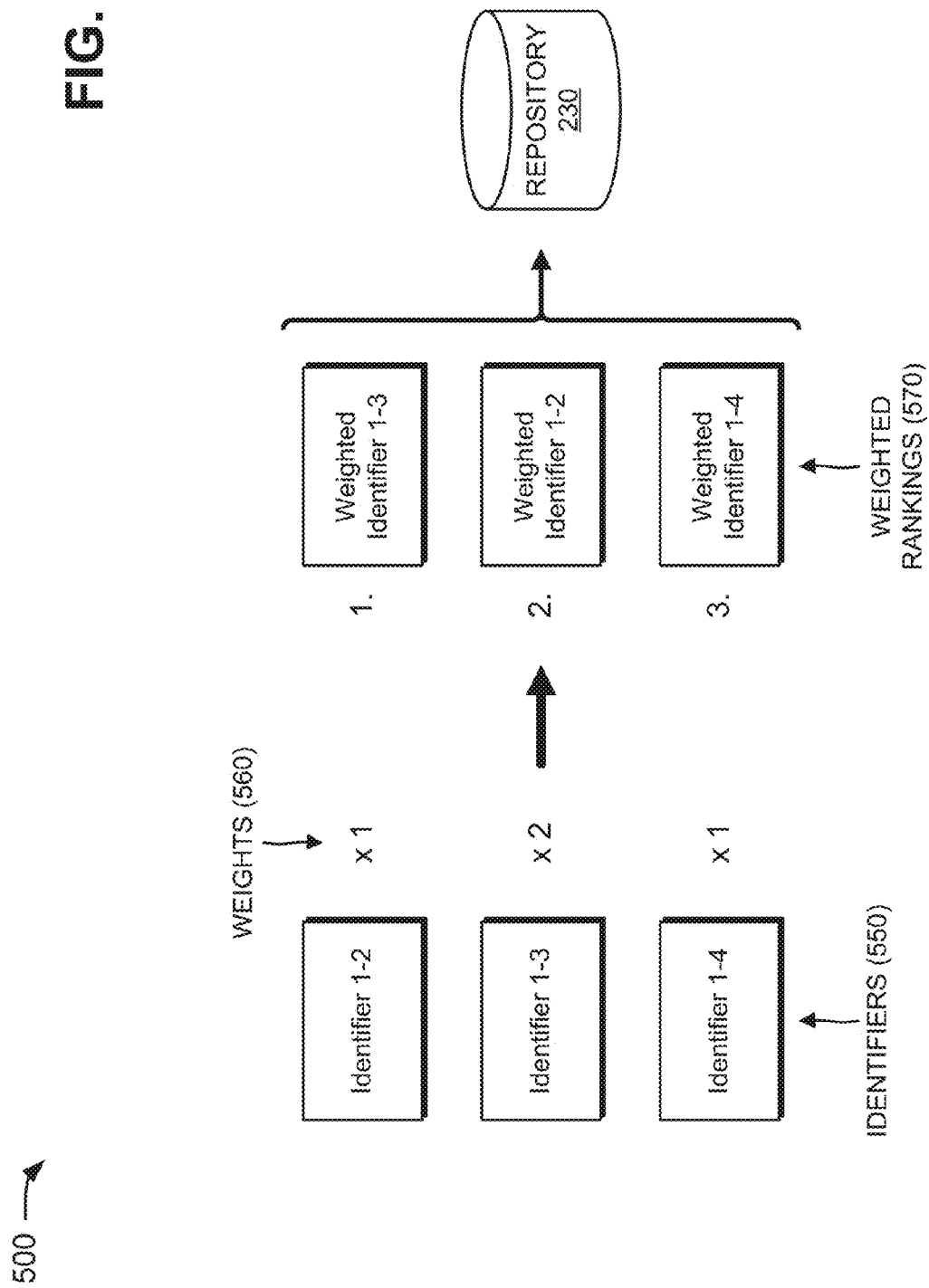

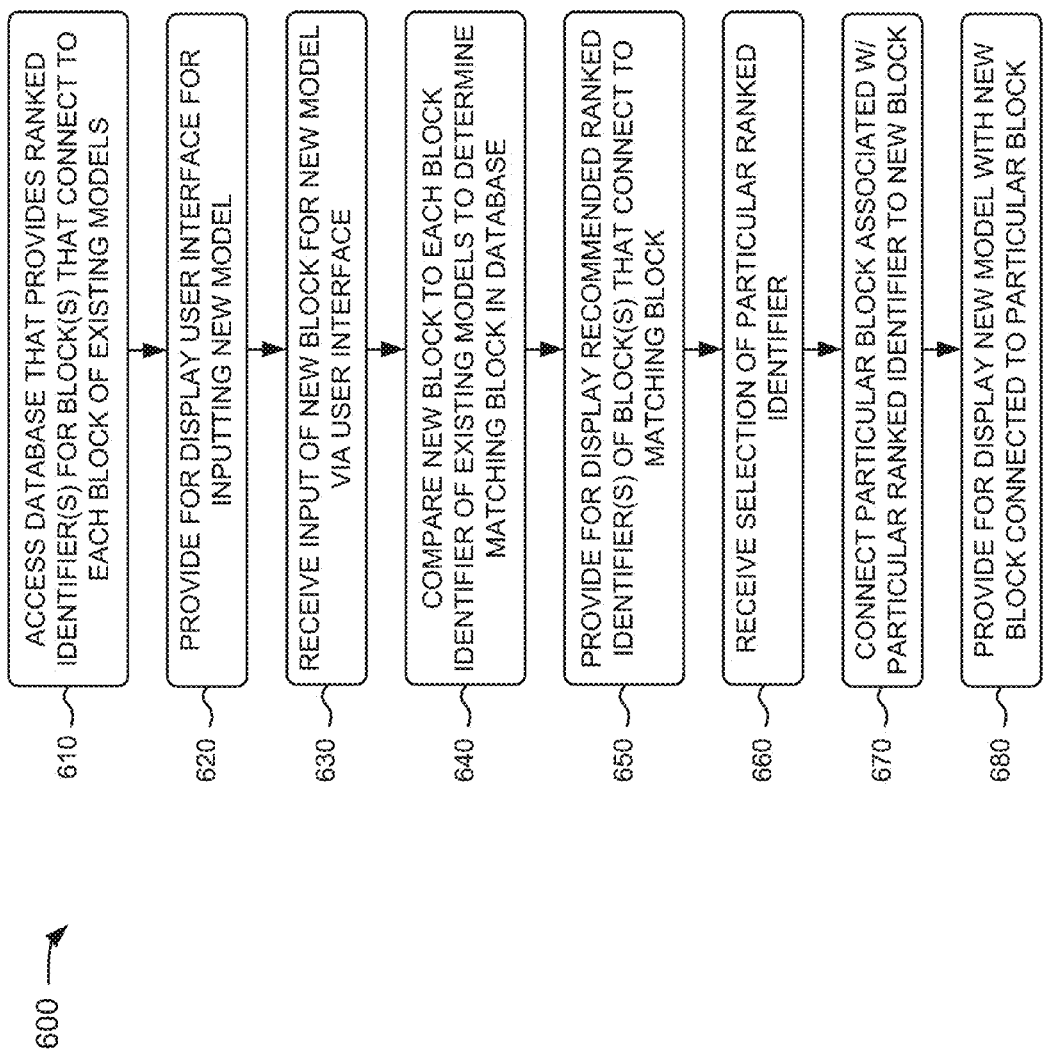

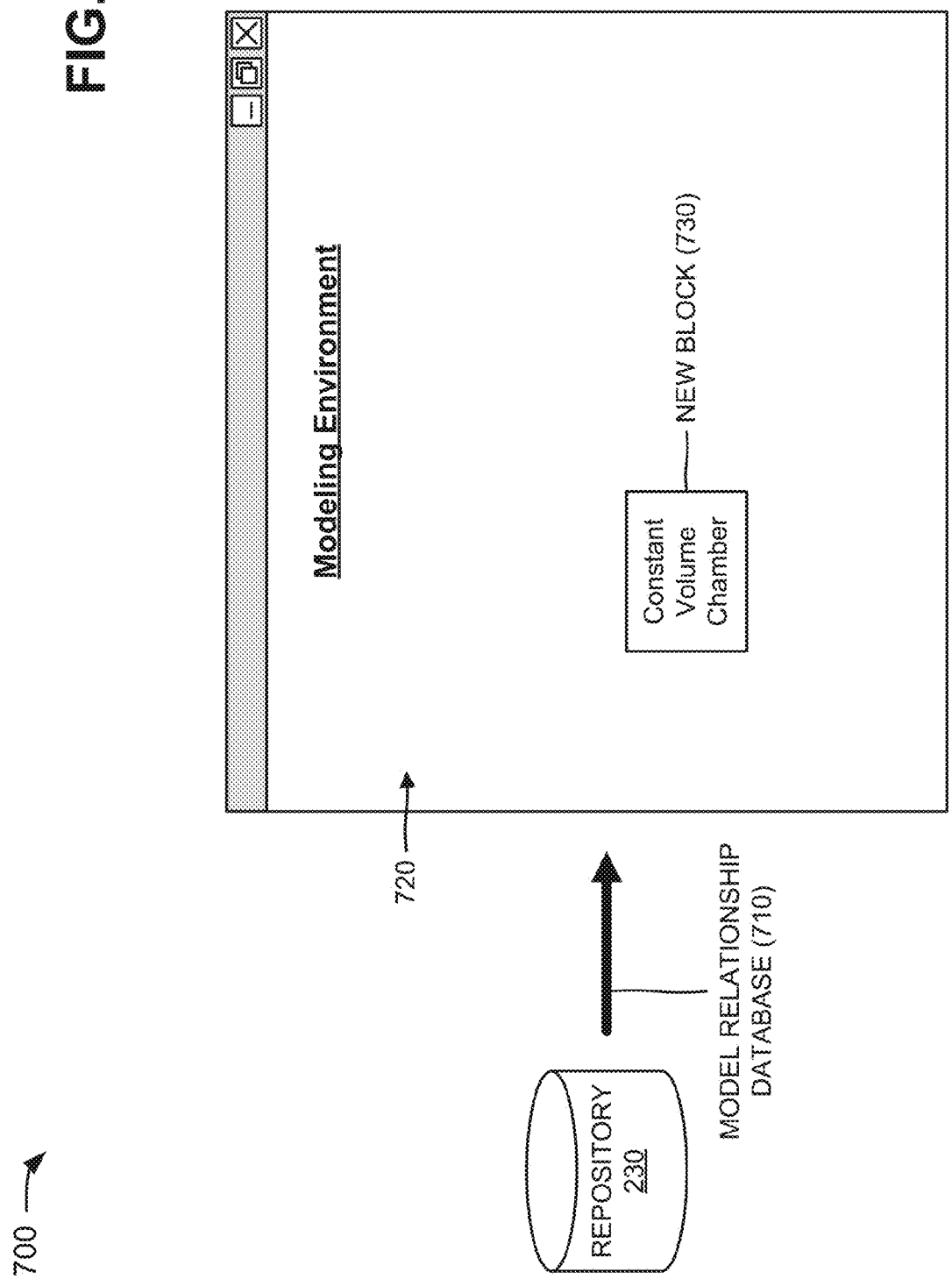

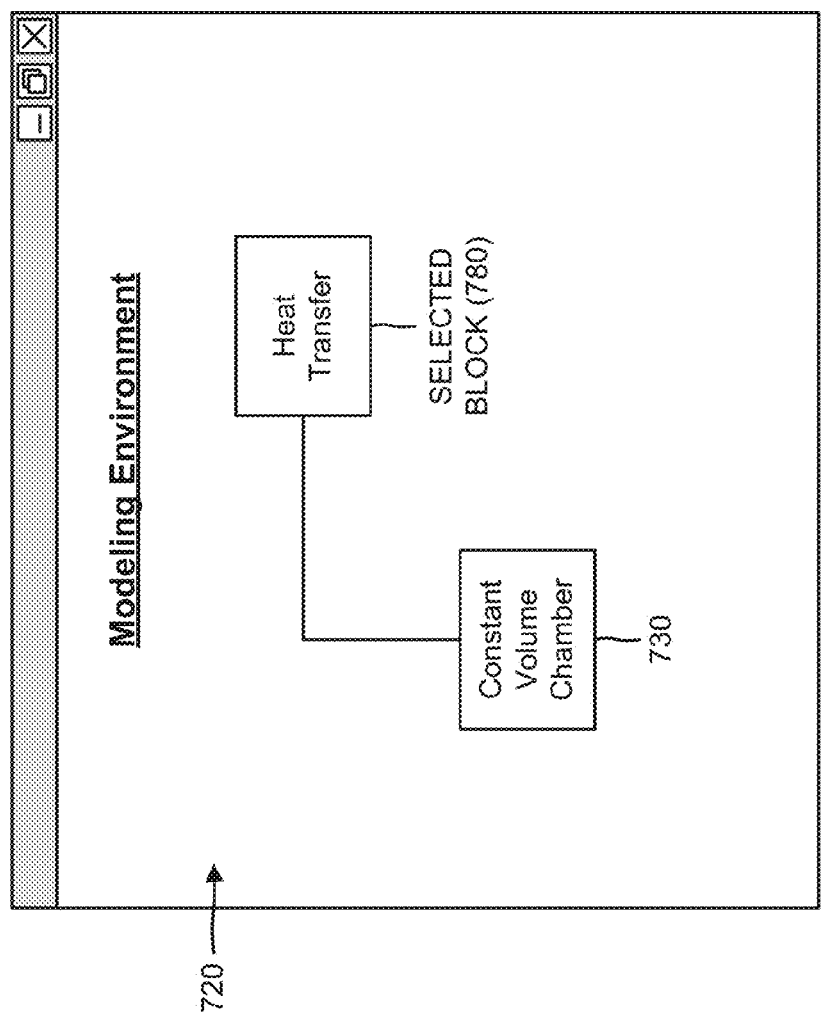

ions and, together with the description,
GENERATING BLOCK RECOMMENDATIONS BASED ON EXISTING MODEL INFORMATION

BRIEF DESCRIPTION OF THE DRAWINGS

The accompanying drawings, which are incorporated in and constitute a part of this specification, illustrate one or more implementations and, together with the description, explain these implementations. In the drawings:

FIG. 2 is a diagram of an example environment in which systems and/or methods described herein may be implemented;

FIG. 3 is a diagram of example components of one or more of the devices of the environment depicted in FIG. 2;

FIG. 4 is a flow chart of an example process for creating a database of block relations based on existing model information;

FIGS. 5A-5F are diagrams of an example of the process described in connection with FIG. 4;

FIG. 6 is a flow chart of an example process for using a database of block relations to provide recommendations; and FIGS. 7A-7E are diagrams of an example of the process described in connection with FIG. 6.

DETAILED DESCRIPTION

The following detailed description refers to the accompanying drawings. The same reference numbers in different drawings may identify the same or similar elements.

A modeling environment (e.g., the Simscape™ software by The MathWorks, Inc.) that employs a physical network approach may include a set of block libraries and special simulation features for modeling physical systems. The physical network approach is particularly suited for simulating systems that consist of real physical components. This modeling environment permits creation of a network representation of a system under design, based on the physical network approach. According to the physical network approach, each system is represented by functional blocks that interact with each other by exchanging information through their connection nodes or ports. The nodes may be bidirectional and mimic physical connections between blocks.

However, modeling environments often do not provide much insight into a correct way to connect blocks of physical system models. Thus, a creator of a physical system model is unable to determine if blocks of the model are correctly connected until the model is simulated. When the model is simulated and blocks are incorrectly connected, the modeling environment may output connection error messages. However, the connection error messages are typically confusing and provide little insight into the correct way to connect the blocks of the model.

OVERVIEW

Systems and/or methods described herein may provide recommendations for blocks that may connect to blocks of a physical system model. The systems and/or methods may retrieve information associated with existing models from a corpus of documents, and may determine relations between blocks of the existing models. The systems and/or methods may assign weights to the relations between the blocks, and may utilize the weights to generate the recommendations. When a new block of a new model is created, the systems and/or methods may provide recommendations for the new block based on the block relation information obtained from the existing models.

Figure 1:
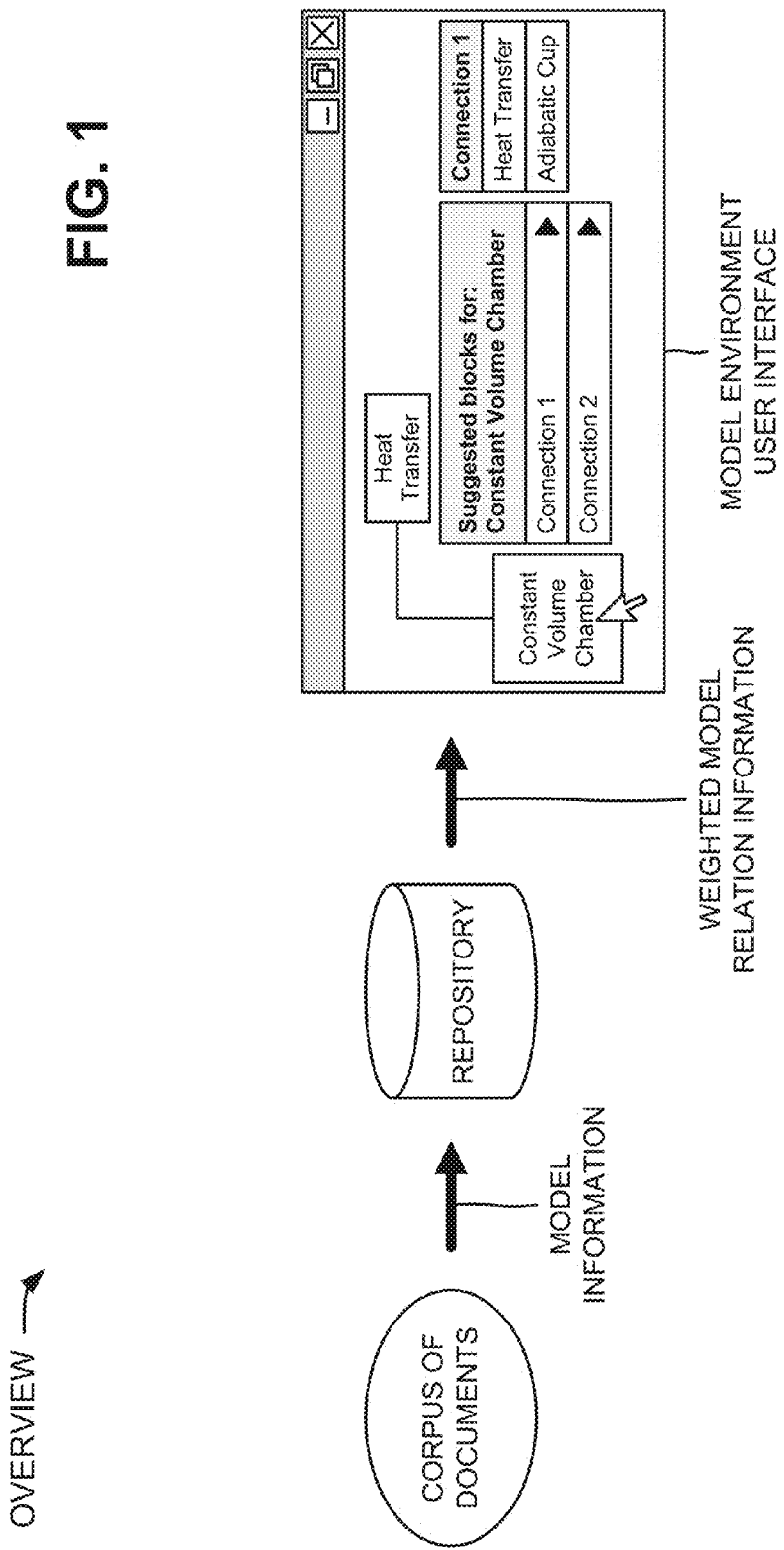
FIG. 1 is a diagram of an overview of an example implementation described herein.

FIG. 1 is a diagram of an overview of an example implementation described herein. For the overview, assume that a device includes or is associated with a repository. The device may identify models in a corpus of documents (e.g., the Internet, company web sites, company databases, university web sites, university databases, etc.), and may retrieve model information, associated with the identified models, from the corpus of documents. The device may store the model information in the repository, and may determine block(s) that connect to each block of the models based on the model information. The device may store, in the repository, identifiers for the block(s) that connect to each block of the models, and may assign weights to the identifiers based on a variety of factors. In some implementations, the device may assign weights to the identifiers based on sources associated with the models (e.g., assign a greater weight for models obtained from reputable web sites), a number of times the block(s) connect to each block of the models, etc.

The device may provide rankings to the identifiers based on the weights assigned to the identifiers. In some implementations, the device may provide higher rankings to identifiers with larger weights than rankings provided to identifiers with smaller weights. The device may store the rankings of the identifiers in the repository. In some implementations, the device may store the identifiers and the rankings of the identifiers as a database, a list, or another type of data structure in the repository. The database of ranked identifiers may be utilized by the device to provide recommended blocks to a user creating a new model in a modeling environment, as described below.

For the overview, further assume that after the database of ranked identifiers is created, a user utilizes the device to access a modeling environment (e.g., a technical computing environment (TCE)-based modeling environment). As further shown in FIG. 1, the modeling environment may provide for display a modeling environment user interface to the user. The modeling environment user interface may enable the user to input a new model to the modeling environment. The user may create a new block (e.g., a Constant Volume Chamber block) for the new model, via the user interface, and the device may receive and provide the new block for display, as shown in FIG. 1. The device may automatically compare the new block to some blocks of the existing models (e.g., stored in the repository via the model information) to determine a matching block in the database. In some implementations, the device may make this comparison when the user selects or hovers over (e.g., with a pointing device, such as mouse) the new block.

The device may provide for display recommended ranked identifier(s) of block(s) that connect to the matching block. As shown in FIG. 1, the device may provide for display a first window that identifies suggested blocks for a first connection (Connection 1) and a second connection (Connection 2) of the new block (e.g., the Constant Volume Chamber block). As further shown in FIG. 1, the device may provide for display a second window that provides ranked identifiers (e.g., a Heat Transfer block identifier and an Adiabatic Cup block identifier) for blocks that may connect to the first connection of the Constant Volume Chamber block. In the overview, further assume that the user selects the Heat Transfer block identifier from the second window, and that device receives the selection of the Heat Transfer block identifier. Based on the selection, the device may create a Heat Transfer block in the new model and may provide for display the new model with the Heat Transfer block. Further, the device may connect the Heat Transfer block to the Constant Volume Chamber block, and may provide for display the new model with the Heat Transfer block connected to the Constant Volume Chamber block, as shown in FIG. 1.

Such an arrangement may provide insight into a correct way to connect blocks of a physical system model, prior to simulating the model. The arrangement may greatly improve a time it takes to create a model by narrowing a number of blocks, to which a particular block can connect, to just blocks that are desired, preferred, or permitted to connect to the particular block. The arrangement may utilize intelligence stored in previously built models to determine block relations and to build the database of ranked identifiers. The arrangement may also prevent confusing connection error messages from being generated when a model is simulated.

A connection, as described herein, may include one or more nodes or ports provided between functional blocks. A connection may enable one functional block to interact and/or exchange information with another functional block.

User interfaces, as described herein, may include graphical user interfaces (GUIs) and/or non-graphical user interfaces, such as text-based interfaces. The user interfaces may provide information to users via customized interfaces (e.g., proprietary interfaces) and/or other types of interfaces (e.g., browser-based interfaces, etc.). The user interfaces may receive user inputs via one or more input devices, may be user-configurable (e.g., a user may change the sizes of the user interfaces, information displayed in the user interfaces, color schemes used by the user interfaces, positions of text, images, icons, windows, etc., in the user interfaces, etc.), and/or may not be user-configurable. Information associated with the user interfaces may be selected and/or manipulated by a user of a technical computing environment (TCE) (e.g., via a touch screen display, a mouse, a keyboard, a keypad, voice commands, etc.).

A document, as the term is used herein, is to be broadly interpreted to include any machine-readable and machine-storable work product. A document may include, for example, an e-mail, a file, a combination of files, one or more files with embedded links to other files, a news group posting, a blog, a web advertisement, a Uniform Resource Locator (URL), etc. In the context of the Internet, a common document is a web page. Web pages often include textual information and may include embedded information (such as meta information, images, hyperlinks, etc.) and/or embedded instructions (such as Javascript, etc.).

Example Environment Arrangement

FIG. 2 is a diagram of an example environment 200 in which systems and/or methods described herein may be implemented. As illustrated, environment 200 may include a client device 210 interconnected with a server device 220, a repository 230, and/or a corpus of documents 250, via a network 260. Components of environment 200 may interconnect via wired and/or wireless connections.

Client device 210 may include one or more computation devices, such as, for example, a laptop computer, a personal computer, a tablet computer, a desktop computer, a workstation computer, a smart phone, a personal digital assistant (PDA), and/or other computation devices. In some implementations, client device 210 may include a TCE 240, described below. In some implementations, client device 210 may connect with repository 230 or may include repository 230.

Server device 220 may include one or more server devices, or other types of computation and communication devices. Server device 220 may include a device that is capable of communicating with client device 210 (e.g., via network 260). In some implementations, server device 220 may include one or more laptop computers, personal computers, workstation computers, servers, central processing units (CPUs), graphical processing units (GPUs), application-specific integrated circuits (ASICs), field-programmable gate arrays (FPGAs), etc. In some implementations, server device 220 may include TCE 240 and may perform some or all of the functionality described herein for client device 210. Alternatively, server device 220 may be omitted and client device 210 may perform all of the functionality described herein for client device 210. In some implementations, server device 220 may connect with repository 230 or may include repository 230.

Repository 230 may include a single memory device or multiple (possibly distributed) memory devices. Repository 230 may store various types of information associated with models, model information (e.g., block relations, block connections, etc.), etc. retrieved from corpus of documents 250.

As indicated above, TCE 240 may be provided within a computer-readable medium of client device 210. Alternatively, or additionally, TCE 240 may be provided in another device (e.g., server device 220) that is accessible by client device 210. TCE 240 may include hardware or a combination of hardware and software that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc. In some implementations, TCE 240 may include a dynamically-typed programming language (e.g., the M language, a MATLAB® language, a MATLAB-compatible language, a MATLAB-like language, etc.) that can be used to express problems and/or solutions in mathematical notations.

For example, TCE 240 may use an array as a basic element, where the array may not require dimensioning. These arrays may be used to support array-based programming where an operation may apply to an entire set of values included in the arrays. Array-based programming may allow array-based operations to be treated as high-level programming that may allow, for example, operations to be performed on entire aggregations of data without having to resort to explicit loops of individual non-array operations. In addition, TCE 240 may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

TCE 240 may further provide mathematical functions and/or graphical tools (e.g., for creating plots, surfaces, images, volumetric representations, etc.). In some implementations, TCE 240 may provide these functions and/or tools using toolboxes (e.g., toolboxes for signal processing, image processing, data plotting, parallel processing, etc.). In some implementations, TCE 240 may provide these functions as block sets or in another way, such as via a library, etc.

TCE 240 may be implemented as a text-based environment (e.g., MATLAB software; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dassault Systèmes; etc.); a graphically-based environment (e.g., Simulink® software, Stateflow® software, SimEvents® software, Simscape™ software, etc., by The MathWorks, Inc.; VisSim by Visual Solutions; LabView® by National Instruments; Dymola by Dassault Systèmes; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; aspects of a Unified Modeling Language (UML) or SysML environment; etc.); or another type of environment, such as a hybrid environment that includes one or more of the above-referenced text-based environments and one or more of the above-referenced graphically-based environments.

TCE 240 may include a programming language (e.g., the MATLAB language) that may be used to express problems and/or solutions in mathematical notations. The programming language may be dynamically typed and/or array-based. In a dynamically typed array-based computing language, data may be contained in arrays and data types of the data may be determined (e.g., assigned) at program execution time.

For example, suppose a program, written in a dynamically typed array-based computing language, includes the following statements:

A='hello'
A=int32([1, 2])
A=[1.1, 2.2, 3.3]

Now suppose the program is executed, for example, in a TCE, such as TCE 240. During run-time, when the statement "A='hello'" is executed the data type of variable "A" may be a string data type. Later when the statement "A=int32([1, 2])" is executed the data type of variable "A" may be a 1-by-2 array containing elements whose data type are 32 bit integers. Later, when the statement "A=[1.1, 2.2, 3.3]" is executed, since the language is dynamically typed, the data type of variable "A" may be changed from the above 1-by-2 array to a 1-by-3 array containing elements whose data types are floating point. As can be seen by this example, data in a program written in a dynamically typed array-based computing language may be contained in an array. Moreover, the data type of the data may be determined during execution of the program. Thus, in a dynamically type array-based computing language, data may be represented by arrays and data types of data may be determined at run-time.

TCE 240 may provide mathematical routines and a high-level programming language suitable for non-professional programmers and may provide graphical tools that may be used for creating plots, surfaces, images, volumetric representations, or other representations. TCE 240 may provide these routines and/or tools using toolboxes (e.g., toolboxes for signal processing, image processing, data plotting, parallel processing, etc.). TCE 240 may also provide these routines in other ways, such as, for example, via a library, local or remote database (e.g., a database operating in a computing cloud), remote procedure calls (RPCs), and/or an application programming interface (API). TCE 240 may be configured to improve runtime performance when performing computing operations. For example, TCE 240 may include a just-in-time (JIT) compiler.

Corpus of documents 250 may include existing models, model information, model examples, model demos, etc. created by tool experts, physical systems experts, model developers, domain experts, etc. Corpus of documents 250 may be stored publicly, such as on the Internet (e.g., on web sites, in databases, etc.) and/or may be stored privately, such as on a company intranet, in internal company databases, etc. In some implementations, corpus of documents 250 may be provided on a web site of a model developer, such as a developer of TCE 240.

Network 260 may include a network, such as a local area network (LAN), a wide area network (WAN), a metropolitan area network (MAN), a telephone network, such as the Public Switched Telephone Network (PSTN) or a cellular network, an intranet, the Internet, or a combination of networks.

Although FIG. 2 shows example components of environment 200, in some implementations, environment 200 may include fewer components, different components, differently arranged components, or additional components than those depicted in FIG. 2. Alternatively, or additionally, one or more components of environment 200 may perform one or more tasks described as being performed by one or more other components of environment 200.

Example Device Architecture

FIG. 3 is an example diagram of a device 300 that may correspond to one or more of the devices of environment 200. As illustrated, device 300 may include a bus 310, a processing unit 320, a main memory 330, a read-only memory (ROM) 340, a storage device 350, an input device 360, an output device 370, and/or a communication interface 380. Bus 310 may include a path that permits communication among the components of device 300.

Processing unit 320 may include one or more processors, microprocessors, or other types of processing units that may interpret and execute instructions. Main memory 330 may include one or more random access memories (RAMs) or other types of dynamic storage devices that may store information and/or instructions for execution by processing unit 320. ROM 340 may include one or more ROM devices or other types of static storage devices that may store static information and/or instructions for use by processing unit 320. Storage device 350 may include a magnetic and/or optical recording medium and its corresponding drive.

Input device 360 may include a mechanism that permits a user to input information to device 300, such as a keyboard, a camera, an accelerometer, a gyroscope, a mouse, a pen, a microphone, voice recognition and/or biometric mechanisms, a remote control, a touch screen, a neural interface, etc. Output device 370 may include a mechanism that outputs information to the user, including a display, a printer, a speaker, etc. Communication interface 380 may include any transceiver-like mechanism that enables device 300 to communicate with other devices, networks, and/or systems. For example, communication interface 380 may include mechanisms for communicating with another device or system via a network.

As described herein, device 300 may perform certain operations in response to processing unit 320 executing software instructions contained in a computer-readable medium, such as main memory 330. A computer-readable medium may be defined as a non-transitory memory device. A memory device may include space within a single physical memory device or spread across multiple physical memory devices. The software instructions may be read into main memory 330 from another computer-readable medium, such as storage device 350, or from another device via communication interface 380. The software instructions contained in main memory 330 may cause processing unit 320 to perform processes described herein. Alternatively, hardwired circuitry may be used in place of or in combination with software instructions to implement processes described herein. Thus, implementations described herein are not limited to any specific combination of hardware circuitry and software.

Although FIG. 3 shows example components of device 300, in some implementations, device 300 may include fewer components, different components, differently arranged components, or additional components than depicted in FIG. 3. Alternatively, or additionally, one or more components of device 300 may perform one or more tasks described as being performed by one or more other components of device 300.

Example Process for Creating a Database of Block Relations Based on Existing Model Information FIG. 4 is a flow chart of an example process 400 for creating a database of block relations based on existing model information. In some implementations, process 400 may be performed by client device 210 (e.g., TCE 240). In some implementations, process 400 may be performed by another device or a group of devices (e.g., server device 220) separate from or including client device 210.

As shown in FIG. 4, process 400 may include identifying models in a corpus of documents (block 410). For example, client device 210/TCE 240 may identify models in corpus of documents 250. In some implementations, client device 210/TCE 240 may periodically, or when instructed by a user, crawl through corpus of documents 250 to identify models in corpus of documents 250. In some implementations, client device 210/TCE 240 may utilize keywords, such as "model," "block," modeling environment names, model software names, etc., to identify models in corpus of documents 250. In some implementations, client device 210/TCE 240 may utilize web crawlers to identify models in corpus of documents 250. A web crawler may start with addresses (e.g., Uniform Resource Locators (URLs)) of links to visit. For each address on the list, the web crawler may visit the document associated with the address. The web crawler may identify models within the visited document associated with the address. The web crawler may also identify outgoing links within the visited document and add addresses associated with these links to the list of addresses. In some implementations, client device 210/TCE 240 may utilize search engines (e.g., by searching for keywords, such as modeling, Simulink model, power train, robot, etc.) to identify models in corpus of documents 250.

As further shown in FIG. 4, process 400 may include retrieving model information for the identified models (block 420). For example, client device 210/TCE 240 may retrieve model information, associated with the identified models, from corpus of documents 250. In some implementations, the model information may include information associated with sources of the models (e.g., public sources, private sources, reputable model sources, etc.); information identifying block(s) that connect to each block of the models (e.g., block relationship information); information identifying creators of the models; information identifying block types (e.g., an electrical block, a mechanical block, a resistor block, a pump block, etc.) for the blocks of the models; information identifying a number of times blocks connect to other blocks; etc. In some implementations, client device 210 may store the model information in repository 230 and/or storage device 350.

As further shown in FIG. 4, process 400 may include determining block(s) that connect to each (or some) block of the models, based on the model information (block 430). For example, client device 210/TCE 240 may utilize the model information to determine one or more blocks that connect each (or some) block of the models identified in corpus of documents 250. In some implementations, once a first block is determined to connect to a second block in a model, client device 210/TCE 240 may create an identifier for the connection between the first block and the second block. If client device 210/TCE 240 encounters another instance of the connection between the first block and the second block in another model, client device 210/TCE 240 may not create another identifier for the connection, but may implement a counter with the identifier. For example, if client device 210/TCE 240 encounters the connection between the first block and the second block four times, client device 210/TCE 240 may allocate a value of four to the counter. In some implementations, client device 210/TCE 240 may analyze each (or some) block of the models, and may create identifiers for first instances of connections between each block of the models and another block of the model.

In some implementations, client device 210/TCE 240 may determine the connections between the blocks of the models by identifying nodes or ports interconnecting the blocks. Each block may include multiple nodes or ports, and thus, may connect to multiple other blocks. Each node or port may connect two blocks of the model together, and may provide an indication of the connection or relationship between the two blocks of the model. In some implementations, client device 210/TCE 240 may utilize functions (e.g., a get parameter function, a set parameter function, a customization parameter, an add block parameter, an add line parameter, a find system parameter, etc.) to determine the connections between the blocks of the models.

Returning to FIG. 4, process 400 may include storing identifiers for the block(s) that connect to each block of the models in a repository (block 440). For example, client device 210/TCE 240 may store, in repository 230 and/or storage device 350, the identifiers created for the first instances of the connections between each block of the models and another block of the model. In some implementations, the identifiers may provide indications of relationships between the blocks of the models. In some implementations, client device 210/TCE 240 may store the identifiers in a database, a list, or another type of data structure, provided in repository 230 and/or storage device 350. In some implementations, client device 210/TCE 240 may associate additional information with the identifiers, such as, for example, block information (e.g., block identifiers for each block of the models), counters describing a number of times the connections are encountered, information associated with sources of the models (e.g., a private vetted database of models, a public web site, a modeling environment developer web site, etc.), block type information (e.g., electrical type, mechanical type, etc.), etc.

As further shown in FIG. 4, process 400 may include assigning weights to the identifiers based on sources of the models and/or a number of times the block(s) connect to each block of the models (block 450). For example, client device 210/TCE 240 may assign weights to the identifiers based on sources of the models in corpus of documents 250. In some implementations, client device/TCE 240 may assign higher weights to identifiers associated with models provided in a private source (e.g., an internal company database) than to identifiers associated with models provided in a public source (e.g., a web site). In some implementations, client device 210/TCE 240 may assign weights to the identifiers based on a number of times the connections, associated with the identifiers, are encountered in the models. For example, client device 210/TCE 240 may utilize the values associated with the counters to assign weights to the identifiers (e.g., an identifier associated with counter value of four may be weighted higher than an identifier associated with counter value two).

In some implementations, client device 210/TCE 240 may utilize other information to assign weights to the identifiers. For example, if a particular identifier is associated with a model created by model developer, a tool expert, a model expert, or some other person with particular credentials, client device 210/TCE 240 may assign a higher weight to the particular identifier than to identifiers associated with models created by unknown users. Client device 210/TCE 240 may assign higher weights to identifiers associated with models provided on a web site of a reputable modeling environment developer than to identifiers associated with models provided on a web site.

Returning to FIG. 4, process 400 may include providing rankings to the identifiers based on the weights assigned to the identifiers (block 460). For example, client device 210/TCE 240 may rank the identifiers based on the weights assigned to the identifiers. In some implementations, if a particular block is associated with multiple identifiers, client device 210/TCE 240 may rank the multiple identifiers from highest to lowest based on the weights assigned to the identifiers. For example, the identifier with the highest weight may be ranked first, the identifier with the second highest weight may be ranked second, and so on.

As further shown in FIG. 4, process 400 may include storing the rankings of the identifiers in the repository (block 470). For example, client device 210/TCE 240 may store the rankings of the identifiers in repository 230 and/or storage device 350. In some implementations, client device 210/TCE 240 may store the rankings of the identifiers, the identifiers, and/or the additional information (e.g., block identifiers, counters, model sources, etc.) in a database, a list, or another type of data structure, provided in repository 230 and/or storage device 350. The rankings, the identifiers, and/or the additional information may be utilized to provide recommendations for blocks that may connect to blocks of a physical system model, as described below in connection with FIGS. 6-7E.

While FIG. 4 shows process 400 as including a particular quantity and arrangement of blocks, in some implementations, process 400 may include fewer blocks, additional blocks, or a different arrangement of blocks. Additionally, or alternatively, some of the blocks may be performed in parallel.

Figure 5A:
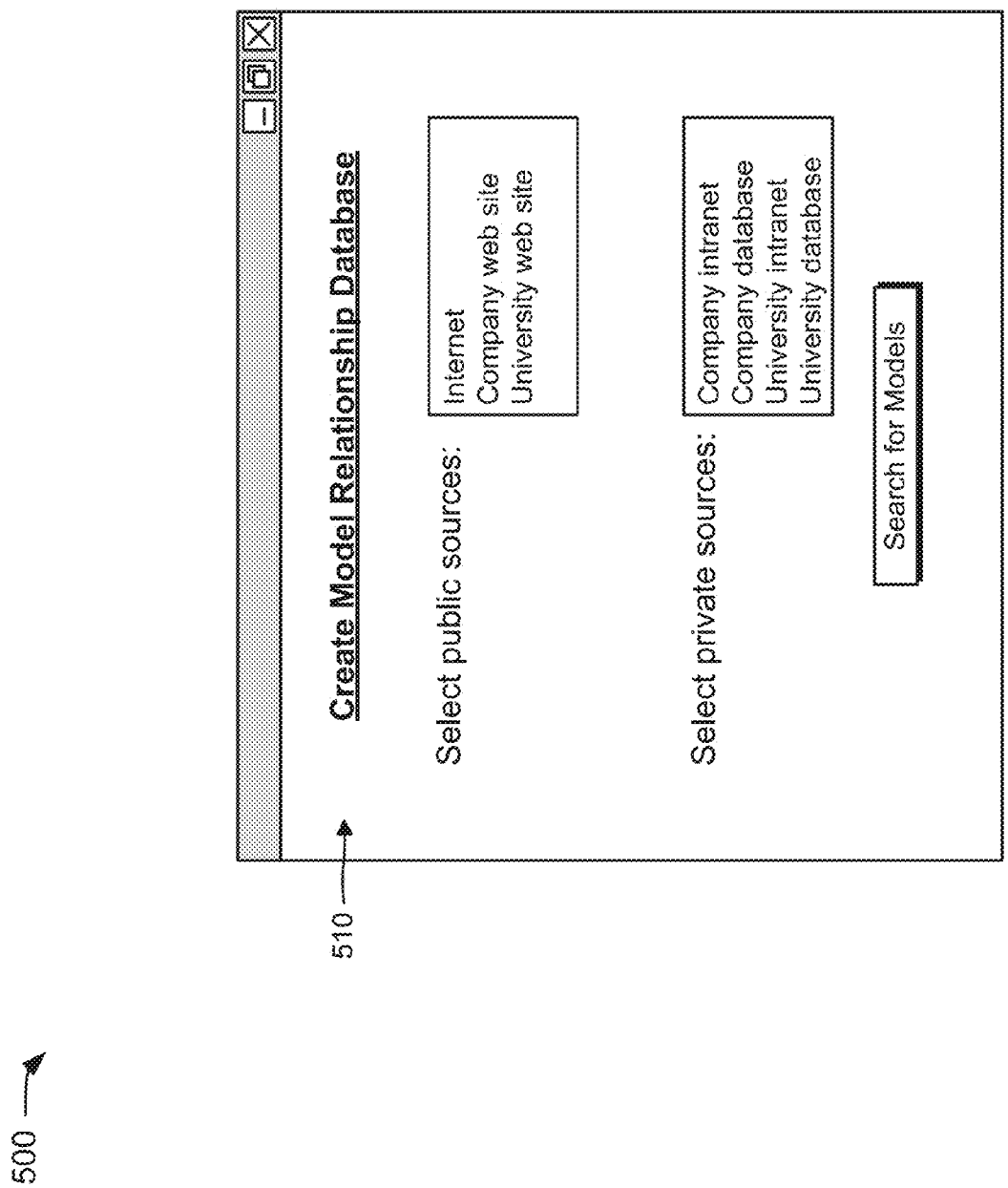

Example Creation of a Block Relations Database Based on Existing Model Information FIGS. 5A-5F are diagrams of an example 500 of the process described above with respect to FIG. 4. In example 500, assume that client device 210/TCE 240 provides a user interface 510 for display to a user. As shown in FIG. 5A, user interface 510 may include information that enables a user to create a model relationship database, such as the database of the rankings of the identifiers, the identifiers, and/or the additional information described above in connection with FIG. 4. For example, user interface 510 may include information instructing the user to select public sources (e.g., the Internet, a company web site, a university web site, etc.) from which to search for models and/or model information for the model relationship database. In some implementations, user interface 510 may include information instructing the user to select private sources (e.g., a company intranet, a company database, a university intranet, a university database, etc.) from which to search for models and/or model information for the model relationship database.

In example 500, assume further that the user selects the public sources and/or the private sources from user interface 510, and selects a mechanism (e.g., a Search for Models button, link, icon, etc.) displayed by user interface 510. The mechanism, when selected, may instruct client device 210/TCE 240 to search for models and/or model information from the selected public sources and/or private sources. In some implementations, the user may not need to select the sources, and client device 210/TCE 240 may search for models and/or model information from all sources accessible by client device 210/TCE 240 or from a set of sources predefined for client device 210/TCE 240.

Figure 5B:
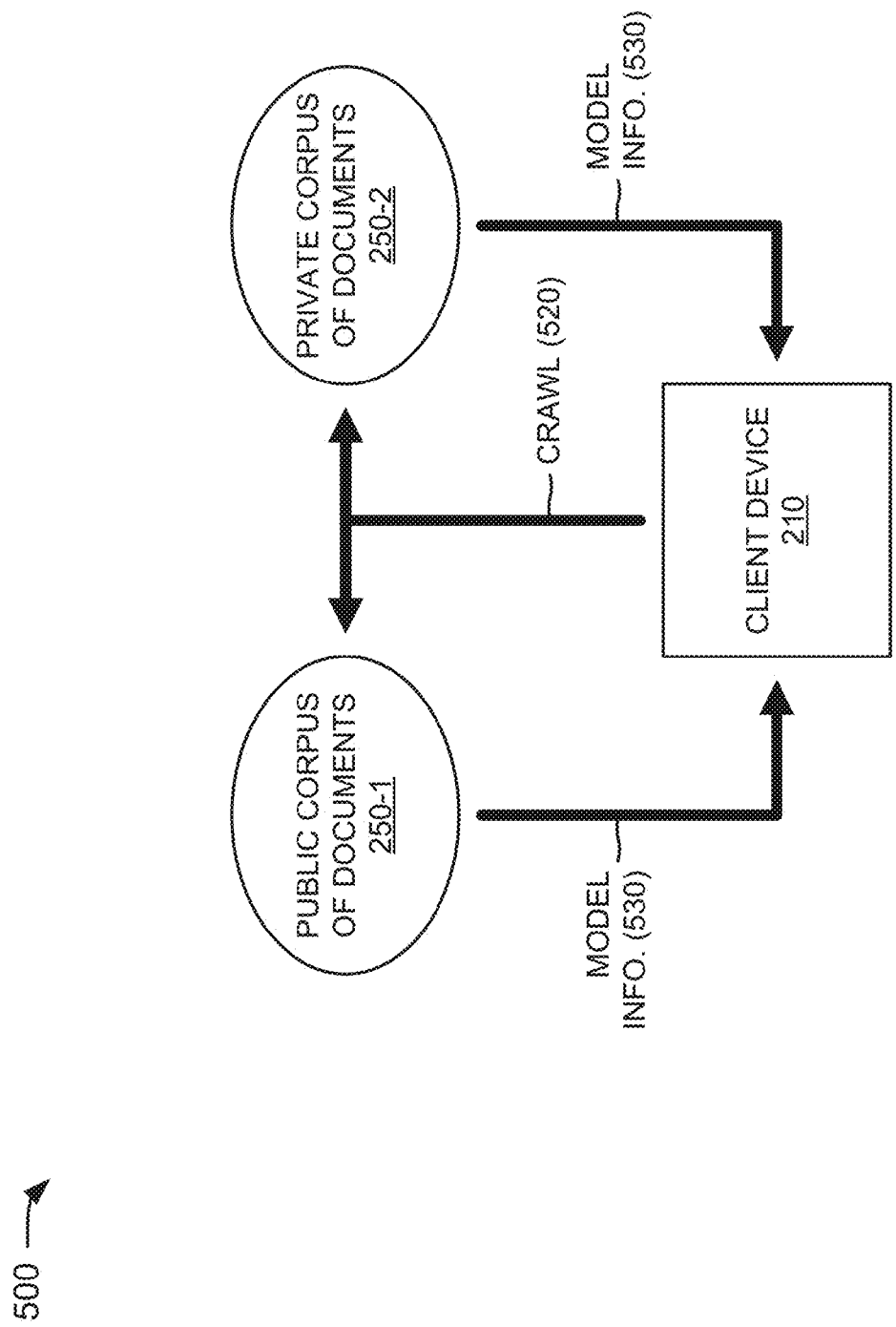

Based on the instruction to search for models and/or model information, client device 210/TCE 240 may crawl through a public corpus of documents 250-1 and/or a private corpus of documents 250-2, as indicated by reference number 520 in FIG. 5B. Public corpus of documents 250-1 may include documents provided by the public sources selected by the user via user interface 510. Private corpus of documents 250-2 may include documents provided by the private sources selected by the user via user interface 510. Client device 210/TCE 240 may crawl through corpus of documents 250-1/250-2 to identify models and/or model information 530 stored in corpus of documents 250-1/250-2.

As further shown in FIG. 5B, client device 210/TCE 240 may retrieve model information 530, associated with the identified models, from corpus of documents 250-1/250-2. In some implementations, model information 530 may include information associated with sources of the models, block relationship information, information identifying creators of the models, information identifying block types for the blocks of the models, information identifying a number of times blocks connect to other blocks, etc. In some implementations, client device 210 may store model information 530 in repository 230 and/or storage device 350.

Figure 5C:
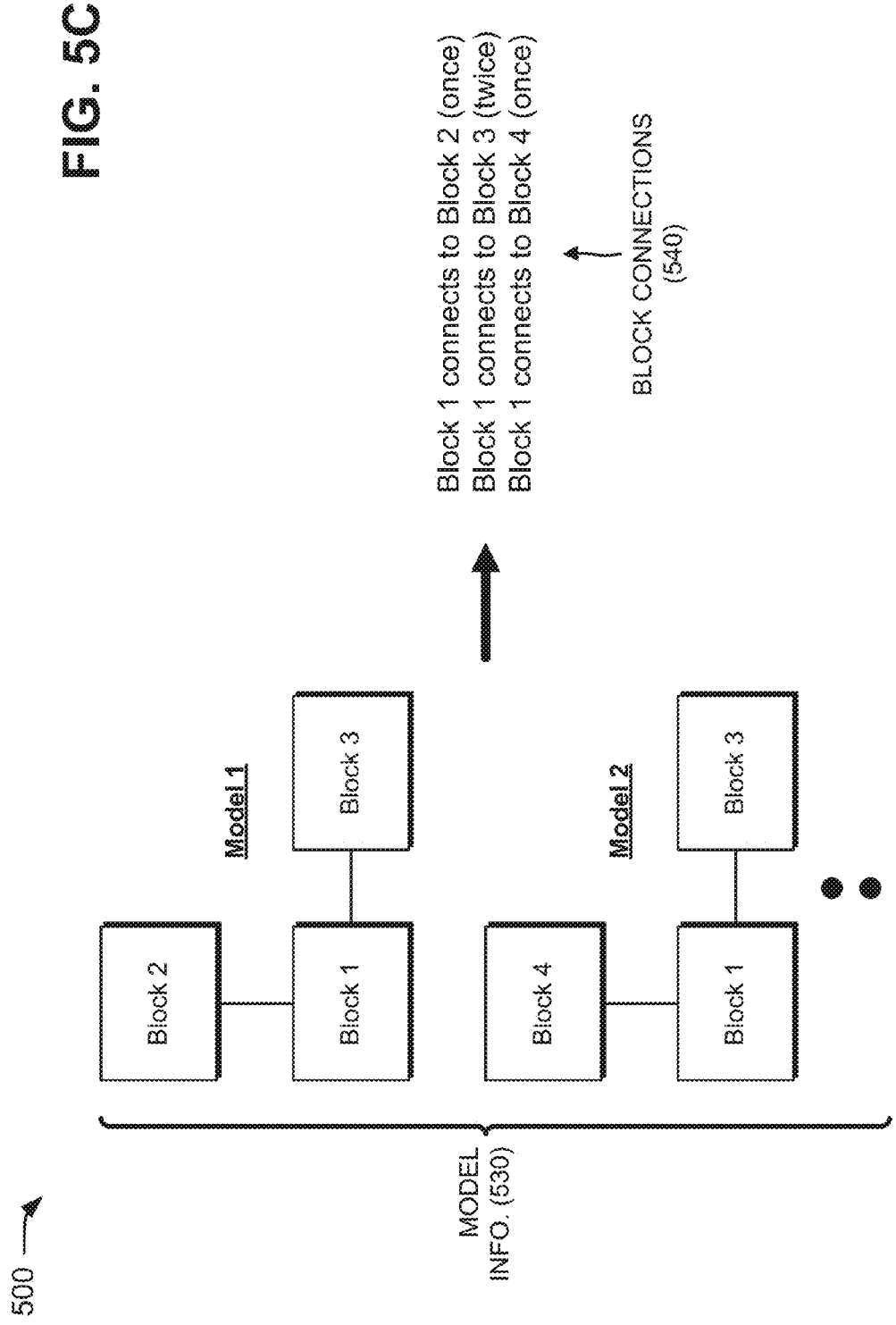

Client device 210/TCE 240 may utilize model information 530 to determine one or more blocks that connect each block of the models identified in corpus of documents 250-1/250-2. For example, as shown in FIG. 5C, model information 530 may include a first model (Model 1) and a second model (Model 2). The first model may include a first block (Block 1) connected to a second block (Block 2) and a third block (Block 3). The second model may include the first block connected to the third block and a fourth block (Block 4). Based on the first model and the second model, client device 210/TCE 240 may determine block connections 540 between the blocks of the first model and the second model, as further shown in FIG. 5C. For example, client device 210/TCE 540 may determine that the first block (Block 1) connects to the second block (Block 2) one time, to the third block (Block 3) two times, and to the fourth block (Block 4) one time.

Figure 5D:
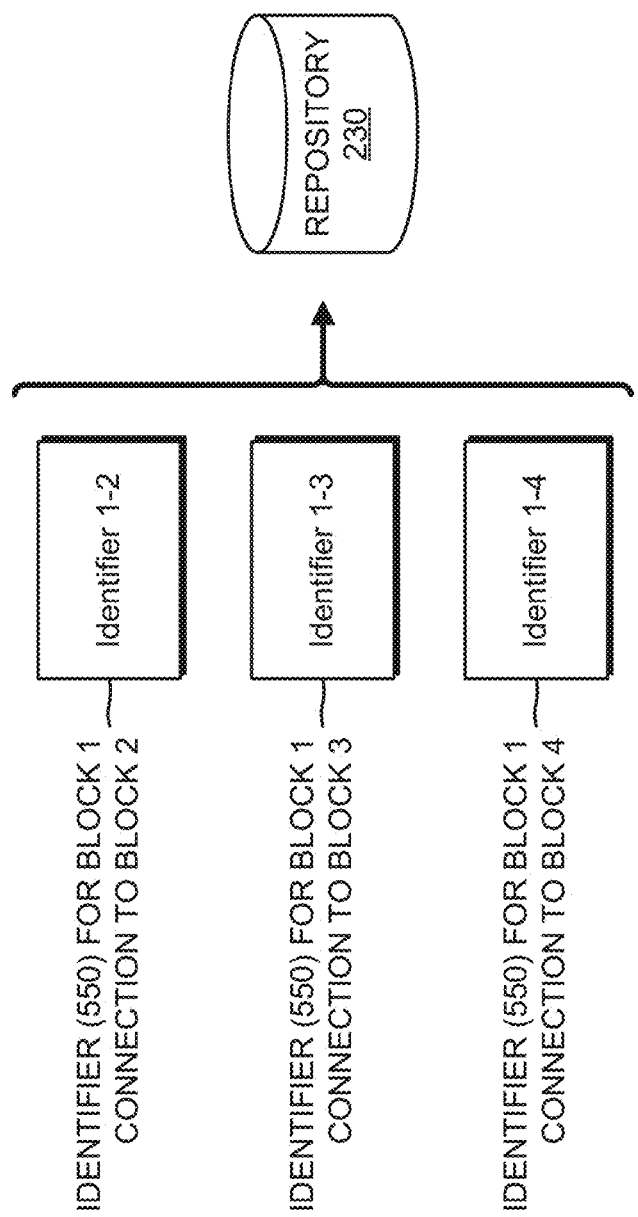

As shown in FIG. 5D, client device 210/TCE 240 may create identifiers 550 for the determined block connections 540 shown in FIG. 5C. For example, client device 210/TCE 240 may create an identifier 550 (e.g., Identifier 1-2) for the first block (Block 1) connection to the second block (Block 2). Client device 210/TCE 240 may create another identifier 550 (e.g., Identifier 1-3) for the first block (Block 1) connection to the third block (Block 3). Client device 210/TCE 240 may create still another identifier 550 (e.g., Identifier 1-4) for the first block (Block 1) connection to the fourth block (Block 4). In some implementations, client device 210/TCE 240 may create a single identifier 550 for a block connection even if client device 210/TCE 240 encounters the block connection more than one time. For example, although the first block connects with the third block two times, client device 210/TCE 240 may allocate a single identifier 550 (Identifier 1-3) for the connection between the first block and the third block. However, client device 210/TCE 240 may allocate a value of two to a counter associated with identifier 550 (Identifier 1-3).

As further shown in FIG. 5D, client device 210/TCE 240 may store identifiers 550 in repository 230. In some implementations, client device 210/TCE 240 may store identifiers 550 in a database, a list, or another type of data structure, provided in repository 230. In some implementations, client device 210/TCE 240 may associate additional information with identifiers 550, such as, for example, block information (e.g., block identifiers for each block of the models), counters describing a number of times the connections are encountered, information associated with sources of the models, block type information, etc.

As shown in FIG. 5E, client device 210/TCE 240 may assign weights 560 to identifiers 550. In some implementations, weights 560 may be generated by client device/TCE 240 based on sources (e.g., publics sources, private sources, etc.) for the models associated with identifiers 550. For example, client device 210/TCE 240 may generate higher weights 560 for identifiers 550 associated with models provided in a private source than weights 560 for identifiers 550 associated with models provided in a public source. In some implementations, client device 210/TCE 240 may assign weights 560 to identifiers 550 based on a number of times the connections, associated with identifiers 550, are encountered in the models. For example, client device 210/TCE 240 may utilize the values associated with the counters to assign weights 560 to identifiers 550. As shown in FIG. 5E, client device 210/TCE 240 may assign a higher weight 560 (e.g., two) to a particular identifier 550 (e.g., Identifier 1-3) than to other identifiers 550 since the particular identifier 550 is associated with a counter value of two.

Assignment of weights 560 to identifiers 550 may generate weighted identifiers 550. For example, assignment of weight 560 to Identifier 1-2 may generate Weighted Identifier 1-2, assignment of weight 560 to Identifier 1-3 may generate Weighted Identifier 1-3, and assignment of weight 560 to Identifier 1-4 may generate Weighted Identifier 1-4. In FIG. 5E, assume that Weighted Identifier 1-3 includes a greater value than Weighted Identifier 1-2 and Weighted Identifier 1-4 since weight 560 of Identifier 1-3 is greater than weights of Identifier 1-2 and Identifier 1-4.

Client device 210/TCE 240 may provide rankings to weighted identifiers 550 in order to generate weighted rankings 570, as further shown in FIG. 5E. For example, client device 210/TCE 240 may rank Weighted Identifier 1-3 first and may rank Weighted Identifier 1-2 and Weighted Identifier 1-4 second and third, respectively. As further shown in FIG. 5E, client device 210/TCE 240 may store weighted rankings 570 of identifiers 550 in repository 230. In some implementations, client device 210/TCE 240 may store weighted rankings 570, identifiers 550, and/or the additional information (e.g., block identifiers, counters, model sources, etc.) in a database, a list, or another type of data structure, provided in repository 230.

Figure 5F:
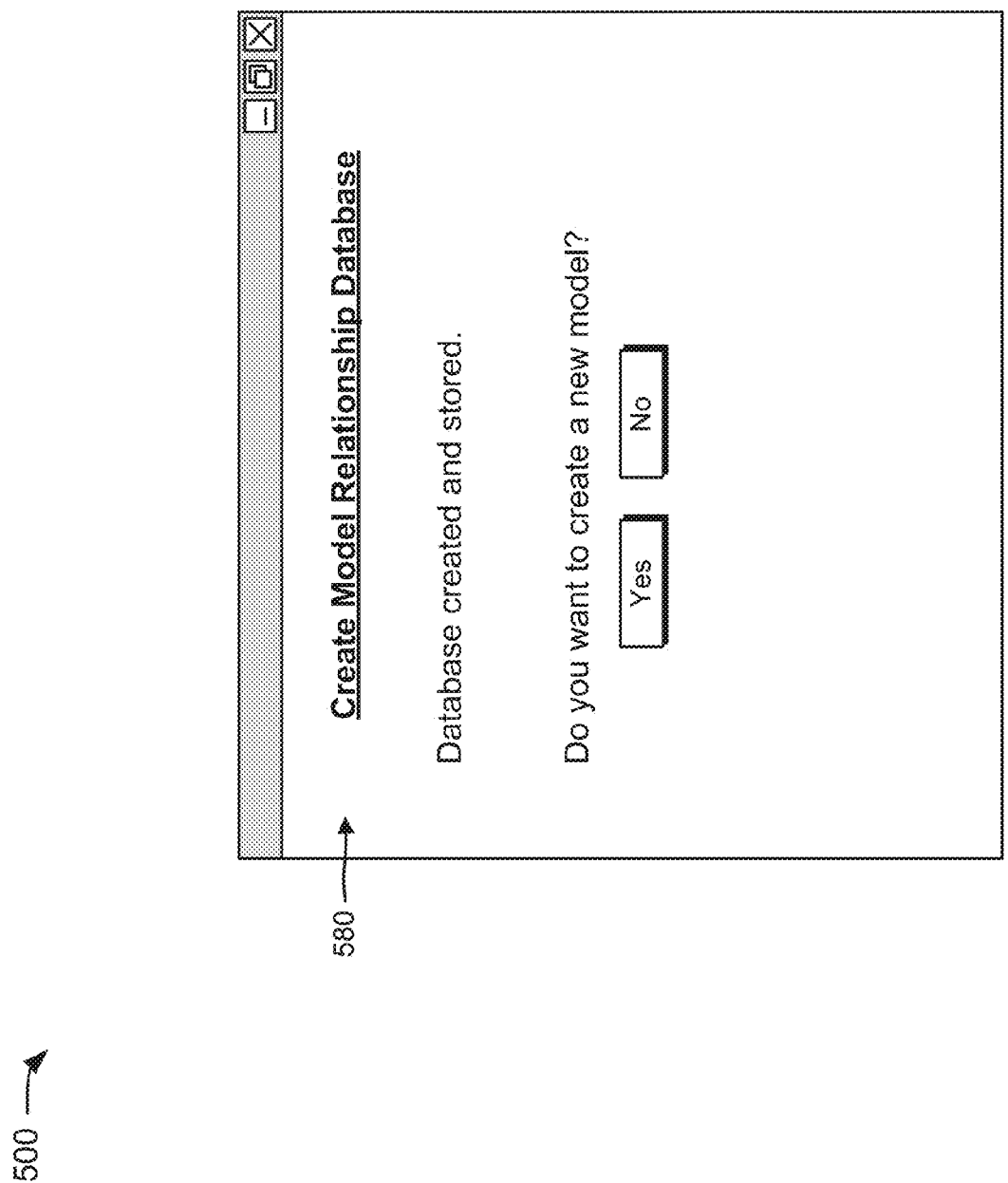

In example 500, after client device 210/TCE 240 finishes crawling (or based on crawling) corpus of documents 250-1/250-2 and stores all of weighted rankings 570, identifiers 550, and/or the additional information retrieved from corpus of documents 250-1/250-2, client device 210/TCE 240 may generate a user interface 580 as shown in FIG. 5F. User interface 580 may include information stating that the model relationship database has been created and stored, and may include information requesting whether the user wants to create a new model. If the user wants to create a new model, the user may select a mechanism (e.g., a Yes button, link, icon, etc.) and client device 210/TCE 240 may provide for display a modeling environment for the user, as described below in connection with FIGS. 6-7E. If the user does not want to create new model, the user may select another mechanism (e.g., a No button, link, icon, etc.).

Example Process for Using a Database of Block Relations to Provide Recommendations FIG. 6 is a flow chart of an example process 600 for using a database of block relations to provide recommendations. In some implementations, process 600 may be performed by client device 210 (e.g., TCE 240). In some implementations, process 600 may be performed by another device or a group of devices (e.g., server device 220) separate from or including client device 210.

As shown in FIG. 6, process 600 may include accessing a database that provides ranked identifier(s) for block(s) that connect to each block of existing models (block 610). For example, client device 210/TCE 240 may access the model relationship database created and stored in repository 230 and/or storage device 250, as described above in connection with FIGS. 4-5F. In some implementations, a modeling environment, provided by client device 210/TCE 240, may automatically access the model relationship database when needed.

As further shown in FIG. 6, process 600 may include providing for display a user interface for inputting a new model (block 620). For example, client device 210 may execute a modeling environment (e.g., TCE 240) that generates a user interface for inputting a new model. Client device 210/TCE 240 may provide for display the user interface for inputting a new model to a user of client device 210/TCE 240. In some implementations, the user may create a new block diagram model via the user interface.

As further shown in FIG. 6, process 600 may include receiving input of a new block for the new model via the user interface (block 630). For example, the user may create a new block in the new block diagram via the user interface for inputting a new model. In some implementations, client device 210/TCE 240 may provide a list of blocks that may be added to the new model, and the user may select a block from the list of blocks. Client device 210/TCE 240 may provide for display the selected block in the user interface for inputting a new model. In some implementations, the user may draw or add a new block to the user interface (e.g., with a pointing device, such as mouse) and client device 210/TCE 240 may provide for display the block in the user interface.

Returning to FIG. 6, process 600 may include comparing the new block to each block identifier of the existing models to determine a matching block in the database (block 640). For example, client device 210/TCE 240 may compare properties of the new block to properties of blocks stored with the block identifiers in the model relationship database. If the properties of the new block match properties of a particular block stored with a block identifier in the model relationship database, client device 210/TCE 240 may determine that the particular block is a matching block of the new block. In some implementations, the properties of the blocks for the existing models may be stored in the model relationship database separately from the identifiers. However, the properties of the blocks for the existing models may be associated with the identifiers in the model relationship database.

In some implementations, client device 210/TCE 240 may automatically perform the comparison of the properties of the new block to the properties of blocks stored with the block identifiers in the model relationship database. In such an arrangement, client device 210/TCE 240 may continuously perform the comparison for each new block added to the new model so that the user may easily create the new model based on recommendations provided by client device 210/TCE 240, as described below. In some implementations, client device 210/TCE 240 may perform the comparison when the user selects or hovers over (e.g., with a pointing device) the new block.

As further shown in FIG. 6, process 600 may include providing for display recommended ranked identifier(s) of block(s) that connect to the matching block (block 650). For example, client device 210/TCE 240 may provide for display recommended ranked identifier(s) of block(s) that connect to the matching block. In some implementations, the recommended ranked identifier(s) may include a ranked list of identifier(s) of block(s) that are recommended for connecting to the new block. In some implementations, the recommended ranked identifier(s) may include a ranked list of identifier(s) of block(s) associated with internal, vetted models (e.g., models generated within a company or other organization). In such an arrangement, the ranked list of identifier(s) of block(s) may be expanded (e.g., upon user request) to include identifier(s) of block(s) associated with external models (e.g., models provided on a public web site).

In some implementations, source(s) of the ranked list of identifier(s) of block(s) may be displayed to the user by client device 210/TCE 240. In some implementations, a first block associated with a first identifier of the ranked list of identifier(s) may be displayed as connected to the new block and the user may decide whether to accept the first block or to select another block. In some implementations, the ranked list of identifier(s) of blocks may be ranked based on a block type hierarchy. For example, if the new block is an electrical block (e.g., an amplifier block), the ranked list of identifier(s) may include electrical blocks at one hierarchy and specific electrical blocks (e.g., a capacitor block, a resistor block, etc.) at another hierarchy. In some implementations, the ranked list of identifier(s) may include percentage information associated with the block(s) (e.g., this block has been connected to the new block in 80% of the existing models).

Returning to FIG. 6, process 600 may include receiving selection of a particular ranked identifier (block 660). For example, the user may select a particular ranked identifier from the recommended ranked identifier(s) of block(s) that may connect to the new block, and client device 210/TCE 240 may receive the selection of the particular ranked identifier. In some implementations, the user may utilize a pointing device (e.g., a mouse) or another input device to select the particular ranked identifier from the recommended ranked identifier(s).

As further shown in FIG. 6, process 600 may include connecting a particular block, associated with the particular ranked identifier, to the new block (block 670). For example, client device 210/TCE 240 may insert a particular block, associated with the selected particular ranked identifier, in the new model, and may connect the particular block to the new block in the new model. In some implementations, client device 210 may retrieve the particular block from the modeling environment provided by client device 210. If the modeling environment does not include the particular block, client device 210/TCE 240 may retrieve the particular block from existing models provided in corpus of documents 250.

Returning to FIG. 6, process 600 may include providing for display the new model with the new block connected to the particular block (block 680). For example, client device 210/TCE 240 may provide for display the new model with a port of the new block connected to a port of the particular block associated with the selected particular ranked identifier. In some implementations, the connection between the new block and the particular block may be displayed with a line. Client device 210/TCE 240 may perform process 600 for other ports of the new block, for port(s) of the particular block, and/or for any additional blocks added by the user to the new model.

While FIG. 6 shows process 600 as including a particular quantity and arrangement of blocks, in some implementations, process 600 may include fewer blocks, additional blocks, or a different arrangement of blocks. Additionally, or alternatively, some of the blocks may be performed in parallel.

Example Utilization of a Block Relations Database to Provide Recommendations

Figure 7B:
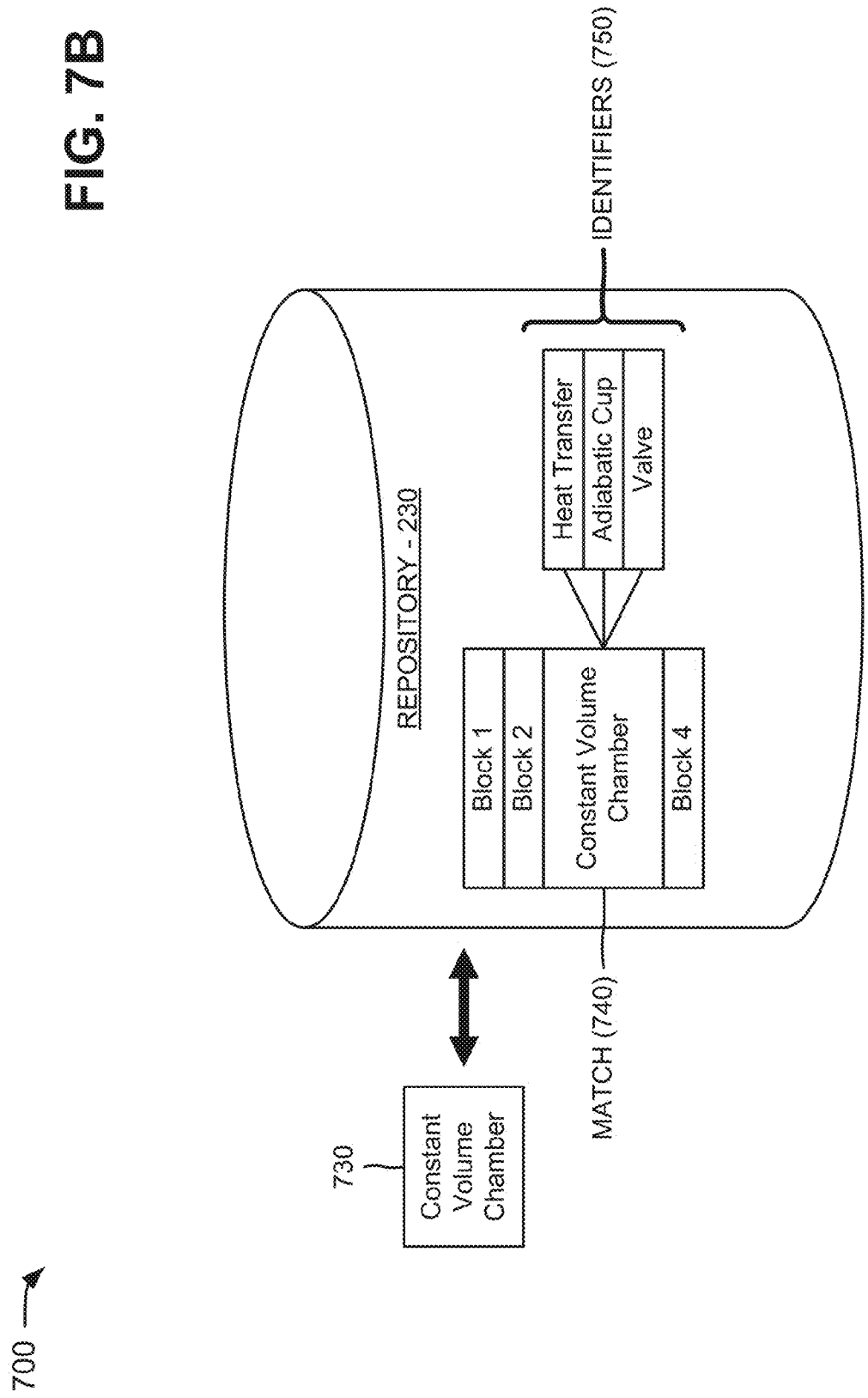

FIGS. 7A-7E are diagrams of an example 700 of the process described above with respect to FIG. 6. In example 700 and as shown in FIG. 7A, assume that client device 210/TCE 240 retrieves or accesses a model relationship database 710, such as the model relationship database described above in connection with FIGS. 4-5F, from repository 230. Further assume that a user of client device 210 accesses a modeling environment (e.g., TCE 240) provided by client device 210, and that client device 210/TCE 240 provides for display a user interface 720, as further shown in FIG. 7A. User interface 720 may provide for display an environment for the user to create a new model, such as a physical system model.

The user may create a new block 730 in the new model via user interface 720. For example, as shown in FIG. 7A, the user may create a Constant Volume Chamber as new block 730. In some implementations, client device 210/TCE 240 may provide a list of blocks that may be added to the new model, and the user may select new block 730 from the list of blocks.

Client device 210/TCE 240 may compare properties of new block 730 to properties of blocks stored in model relationship database 710 of repository 230, as shown in FIG. 7B. If the properties of new block 730 match properties of a particular block (e.g., a Constant Volume Chamber block) stored in model relationship database 710, client device 210/TCE 240 may determine that the particular block is a matching block of new block 730, as indicated by reference number 740. In some implementations, client device 210/TCE 240 may automatically perform the comparison of the properties of new block 730 to the properties of blocks stored in model relationship database 710. In some implementations, client device 210/TCE 240 may perform the comparison when the user selects or hovers over (e.g., with a pointing device) new block 730. As further shown in FIG. 7B, the particular block may be associated with identifiers 750 of blocks that may connect to the particular block. For example, identifiers 750 may include an identifier for a Heat Transfer block, an identifier for an Adiabatic Cup block, and an identifier for a Valve block. In some implementations, identifiers 750 may be provided in a ranked list based on weights assigned to identifiers 750.

Figure 7C:
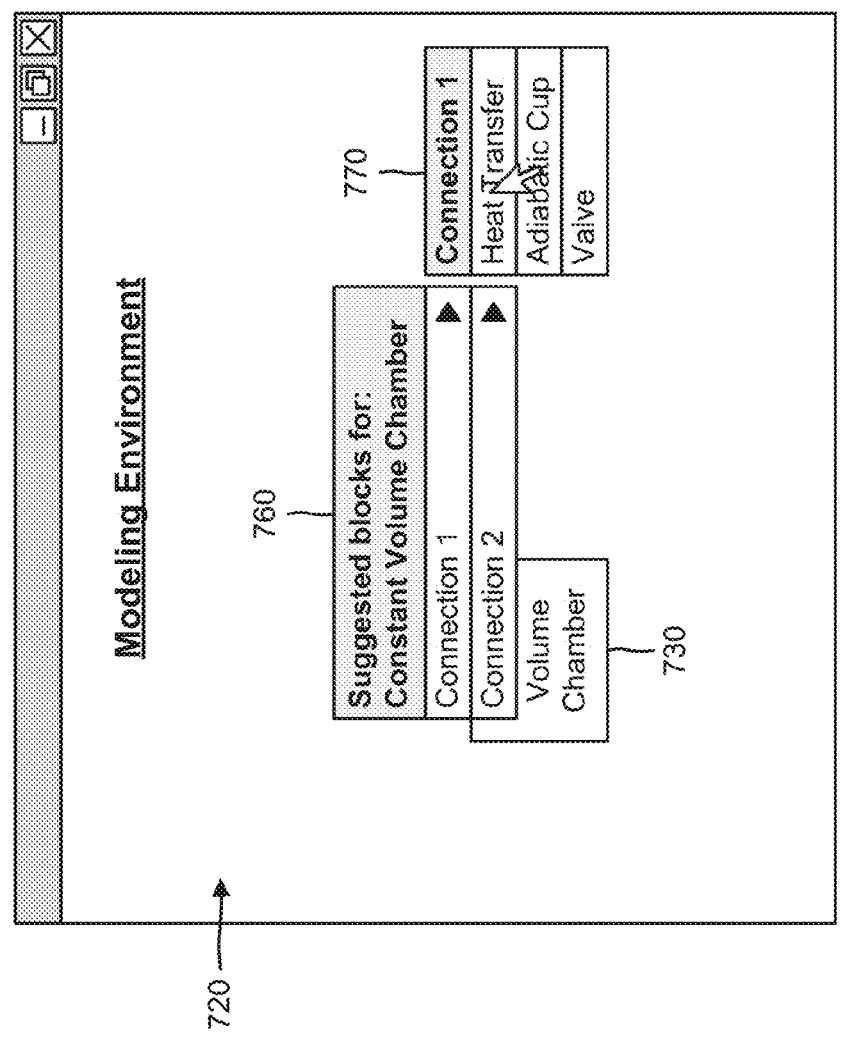

As shown in FIG. 7C, client device 210/TCE 240 may provide for display, via user interface 720, a first window 760 that identifies suggested blocks for a first connection (Connection 1) and a second connection (Connection 2) of new block 730. As further shown in FIG. 7C, client device 210/TCE 240 may provide for display, via user interface 720, a second window 770 that provides a ranked list of identifiers 750 (e.g., the Heat Transfer block identifier, the Adiabatic Cup block identifier, and the Valve identifier) for blocks that may connect to the first connection of new block 730. In example 700, further assume that the user selects the Heat Transfer block identifier from second window 770 (e.g., via a pointing device), and that client device 210/TCE 240 receives the selection of the Heat Transfer block identifier.

Based on the selections, client device 210/TCE 240 may connect a selected block 780 (e.g., a Heat Transfer block), associated with the selected Heat Transfer block identifier, to new block 730 in the new model. In some implementations, client device 210 may retrieve the Heat Transfer block from the modeling environment provided by client device 210. If the modeling environment does not include the Heat Transfer block, client device 210/TCE 240 may retrieve the Heat Transfer block from existing models provided in corpus of documents 250. Client device 210/TCE 240 may provide the Heat Transfer block to the new model. Client device 210/TCE 240 may provide for display, via user interface 720, the new model with a port of new block 730 connected to a port of selected block 780, as shown in FIG. 7D. In some implementations, the connection between new block 730 and selected block 780 may be displayed with a line. Client device 210/TCE 240 may perform the aforementioned functions for other ports of new block 730, for port(s) of selected block 780, and/or for any additional blocks added by the user to the new model.

In some implementations, a block may refer to a system with dynamic behavior (e.g., as a series of ordered values) and may refer to a textual description such as that of a model (e.g., in Modelica). The textual description may contain instructions (e.g., "connect" in Modelica) to connect blocks. The connections may be based on ports that may have causal and non-causal semantics. Also, a port may be assigned a certain domain and this may determine which blocks are valid connections to this port. In some implementations, client device 210/TCE 240 may provide recommendations for blocks that may connect to blocks of a physical system model based on ports and port types (as opposed to blocks and block types). For example, a constant volume chamber may include two ports, a port in the pneumatic domain and a port in the thermal power domain. Each of these ports may include a separate list of ranked connection candidates. Client device 210/TCE 240 may display a different list of recommendations depending on which port a user wishes to connect.

Figure 7E:
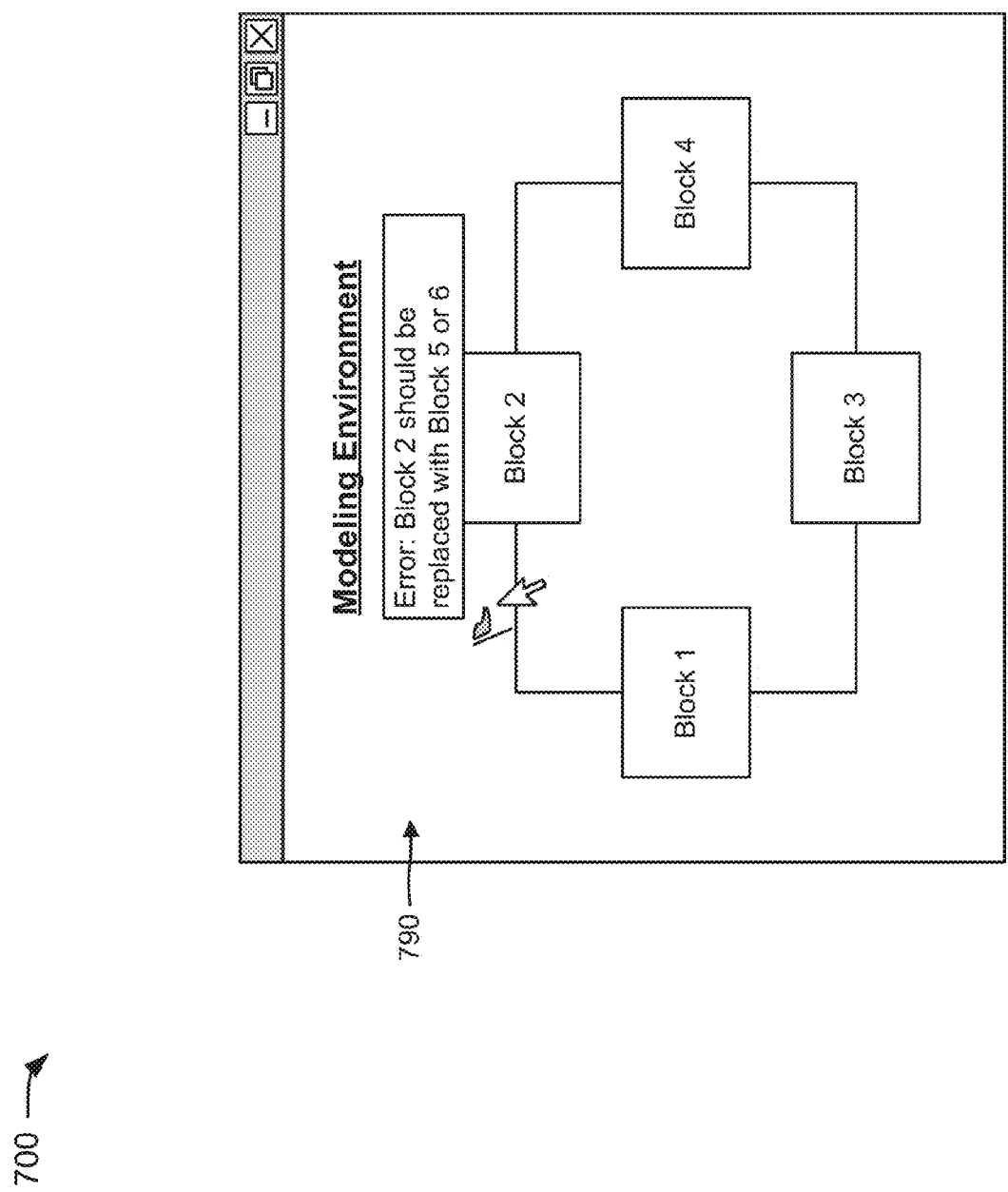

With reference to FIG. 7E, assume that the user previously created a model, as shown in a user interface 790, and wants to check the model for discrepancies against information provided in model relationship database 710. Client device 210/TCE 240 may utilize model relationship database 710 to check the connected blocks of the model shown in user interface 790. If client device 210/TCE 240 discovers discrepancies in the model of user interface 790, based on the check, client device 210/TCE 240 may highlight (e.g., with colors, flags, indicators, etc.) the discrepancies in user interface 790. For example, as further shown in FIG. 7E, client device 210/TCE 240 may highlight (e.g., with a flag) a discrepancy for the connection between a first block (Block 1) and a second block (Block 2) of the model (e.g., the blocks involved may be underlined or outlined in red for an error and in yellow for a warning). In some implementations, client device 210/TCE 240 may display a message, such as a message indicating that "Block 2 should be replaced with Block 5 or 6," as shown in FIG. 7E.

CONCLUSION

Systems and/or methods described herein may provide recommendations for blocks that may connect to blocks of a physical system model. The systems and/or methods may retrieve information associated with existing models from a corpus of documents, and may determine relations between blocks of the existing models. The systems and/or methods may assign weights to the relations between the blocks, and may utilize the weights to generate the recommendations. When a new block of a new model is created, the systems and/or methods may provide recommendations for the new block based on the block relation information obtained from the existing models.

The foregoing description of implementations provides illustration and description, but is not intended to be exhaustive or to limit the implementations to the precise form disclosed. Modifications and variations are possible in light of the above teachings or may be acquired from practice of the implementations.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Further, certain portions of the implementations may be implemented as a "component" that performs one or more functions. This component may include hardware, such as a processor, an ASIC, or a FPGA, or a combination of hardware and software.

Even though particular combinations of features are recited in the claims and/or disclosed in the specification, these combinations are not intended to limit the disclosure of the specification. In fact, many of these features may be combined in ways not specifically recited in the claims and/or disclosed in the specification. Although each dependent claim listed below may directly depend on only one other claim, the disclosure of the specification includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Where only one item is intended, the term "one" or similar language is used. Further, the phrase "based on" is intended to mean "based, at least in part, on" unless explicitly stated otherwise.

What is claimed is:

1. A computer-implemented method comprising:

identifying, in a corpus of documents, models that are used to simulate systems,
the identifying the models being performed by a computer device;

retrieving model information for the identified models,
the retrieving the model information being performed by the computer device;

determining one or more blocks that connect to at least one block of the models based on the model information,
the determining the one or more blocks being performed by the computer device;

creating one or more first identifiers for the one or more blocks that connect to the at least one block of the models,
the creating the one or more first identifiers being performed by the computer device;

creating second identifiers for blocks of the models, based on the model information,
the creating the second identifiers being performed by the computer device;

assigning one or more weights to the one or more first identifiers based on sources of the models or a number of times the one or more blocks connect to the at least one block of the models,
the assigning the one or more weights being performed by the computer device;

ranking the one or more first identifiers based on the one or more weights assigned to the one or more first identifiers, the ranking the one or more first identifiers being performed by the computer device;

storing the ranked one or more first identifiers and the second identifiers in a data structure,
the storing the ranked one or more first identifiers and the second identifiers being performed by the computer device; and providing for display, when input of a block for a model is received, at least one of the ranked one or more first identifiers for the one or more blocks of the models that are used to simulate systems,
the model being used to simulate a system,
the at least one of the ranked one or more first identifiers being provided for display to identify at least one block that can be connected to the block while preventing connection errors when the model is used to simulate the system,
the providing the at least one of the ranked one or more first identifiers for display being performed by the computer device.

2. The method of claim 1, further comprising:
providing for display a user interface for inputting the model to a modeling environment associated with the computer device; and
receiving the input of the block for the model via the user interface.

3. The method of claim 2, further comprising:
comparing the block to the second identifiers, stored in the data structure, to determine a matching block in the data structure; and where providing the at least one of the ranked one or more first identifiers for display includes providing for display, via the user interface, the at least one of the ranked one or more first identifiers of at least one of the one or more blocks,
the at least one of the one or more blocks connecting to the matching block.

4. The method of claim 3, further comprising:
receiving selection of a particular ranked identifier from the at least one of the ranked one or more first identifiers; and
connecting a particular block, associated with the particular ranked identifier, to the block.

5. The method of claim 4, further comprising:
providing for display, via the user interface, the model with the block connected to the particular block.

6. The method of claim 5, further comprising:
comparing the particular block to the second identifiers, stored in the data structure, to determine another matching block in the data structure;
providing for display, via the user interface, one or more other ranked identifiers of one or more other blocks that connect to the other matching block;
receiving selection of another particular ranked identifier from the one or more other ranked identifiers;
connecting another particular block, associated with the other particular ranked identifier, to the particular block; and
providing for display, via the user interface, the model with the particular block connected to the other particular block.

7. The method of claim 1, further comprising:
receiving selection of the sources of the models in the corpus of documents; and
identifying the models from the selected sources of the models in the corpus of documents.

8. A non-transitory computer-readable medium storing instructions, the instructions comprising:
one or more instructions that, when executed by a processor of a device, cause the processor to:
identify, in a corpus of documents, models that are used to simulate systems,
retrieve model information for the identified models,
determine one or more blocks that connect to at least one block of the models, based on the model information,
create one or more first identifiers for the one or more blocks that connect to the at least one block of the models,
create second identifiers for blocks of the models, based on the model information,
assign one or more weights to the one or more first identifiers based on sources of the models or a number of times the one or more blocks connect to the at least one block of the models,
rank the one or more first identifiers based on the one or more weights assigned to the one or more first identifiers,
store the ranked one or more first identifiers and the second identifiers in a data structure, and
provide for display, when input of a block for a model is received, at least one of the ranked one or more first identifiers for the one or more blocks,
the model being used to simulate a system,
the at least one of the ranked one or more first identifiers being provided for display to identify at least one block that can be connected to the block while preventing connection errors when the model is used to simulate the system.

9. The computer-readable medium of claim 8, where the instructions further comprise:
one or more instructions that, when executed by the processor, cause the processor to:
provide for display a user interface for inputting the model to a modeling environment associated with the device, and
receive the input of the block for the model via the user interface.

10. The computer-readable medium of claim 9, where the instructions further comprise:
one or more instructions that, when executed by the processor, cause the processor to:
compare the block to the second identifiers, stored in the data structure, to determine a matching block in the data structure, and
where the one or more instructions to provide the at least one of the ranked one or more first identifiers for display include one or more instructions to provide for display, via the user interface, one or more particular ranked identifiers of one or more blocks that connect to the matching block.

11. The computer-readable medium of claim 10, where the instructions further comprise:
one or more instructions that, when executed by the processor, cause the processor to:
receive selection of a particular ranked identifier from the one or more particular ranked identifiers, and
connect a particular block, associated with the particular ranked identifier, to the block.

12. The computer-readable medium of claim 11, where the instructions further comprise:
one or more instructions that, when executed by the processor, cause the processor to:
provide for display, via the user interface, the model with the block connected to the particular block.

13. The computer-readable medium of claim 12, where the instructions further comprise:
one or more instructions that, when executed by the processor, cause the processor to:
compare the particular block to the second identifiers, stored in the data structure,
to determine another matching block in the data structure,
provide for display, via the user interface, one or more other ranked identifiers of one or more other blocks that connect to the other matching block,
receive selection of another particular ranked identifier from the one or more other ranked identifiers,
connect another particular block, associated with the other particular ranked identifier, to the particular block, and
provide for display, via the user interface, the model with the particular block connected to the other particular block.

14. The computer-readable medium of claim 8, where the instructions further comprise:
one or more instructions that, when executed by the processor, cause the processor to:
receive selection of the sources of the models in the corpus of documents, and
identify the models from the selected sources of the models in the corpus of documents.

15. A device comprising:
one or more processors to:
identify, in a corpus of documents, models that are used to simulate systems,
retrieve model information for the identified models,
determine one or more blocks that connect to at least one block of the models, based on the model information,
create one or more first identifiers for the one or more blocks that connect to the at least one block of the models,
the one or more first identifiers including an identifier for each connection between the one or more blocks and the at least one block of the models,
create second identifiers for blocks of the models, based on the model information,
assign one or more weights to the one or more first identifiers based on sources of the models or a number of times the one or more blocks connect to the at least one block of the models,
rank the one or more first identifiers based on the one or more weights assigned to the one or more first identifiers,
store the ranked one or more first identifiers and the second identifiers in a data structure, and
provide for display, when input of a block for a model is received, at least one of the ranked one or more first identifiers for the one or more blocks,
the model being used to simulate a system,
the at least one of the ranked one or more first identifiers being provided for display to identify at least one block that can be connected to the block while preventing connection errors when the model is used to simulate the system.

16. The device of claim 15, where the one or more processors are further to:
provide for display a user interface for inputting the model to a modeling environment associated with the device, and
receive the input of the block for the model via the user interface.

17. The device of claim 16, where the one or more processors are further to:
compare the block to the second identifiers, stored in the data structure, to determine a matching block in the data structure, and
where, when providing the at least one of the ranked one or more first identifiers for display, the one or more processors are to provide for display, via the user interface, the at least one of the ranked one or more first identifiers of the one or more blocks,
the one or more blocks connecting to the matching block.

18. The device of claim 17, where the one or more processors are further to:
receive selection of a particular ranked identifier from the at least one of the ranked one or more first identifiers, and
connect a particular block, associated with the particular ranked identifier, to the block.

19. The device of claim 18, where the one or more processors are further to:
provide for display, via the user interface, the model with the block connected to the particular block.

20. The device of claim 15, where the one or more processors are further to:
receive selection of the sources of the models in the corpus of documents, and identify the models from the selected sources of the models in the corpus of documents.

\* \* \* \* \*